United States Patent
Wu et al.

(10) Patent No.: US 8,611,175 B2
(45) Date of Patent: Dec. 17, 2013

(54) CONTENTION-FREE MEMORY ARRANGEMENT

(75) Inventors: Ephrem C. Wu, San Mateo, CA (US); Gyanesh Saharia, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 204 days.

(21) Appl. No.: 13/314,079

(22) Filed: Dec. 7, 2011

(65) Prior Publication Data

US 2013/0148450 A1 Jun. 13, 2013

(51) Int. Cl.
*G11C 8/00* (2006.01)
(52) U.S. Cl.
USPC ............ 365/230.05; 365/189.03; 365/223; 365/230.03; 711/149
(58) Field of Classification Search
USPC ............ 365/189.03, 223, 230.03, 230.05; 711/149
See application file for complete search history.

(56) References Cited

U.S. PATENT DOCUMENTS

| 7,120,081 B2 * | 10/2006 | Lee ................... 365/230.05 |
| 2011/0188335 A1 * | 8/2011 | Roy et al. ............ 365/230.03 |

OTHER PUBLICATIONS

Iyer, S., et al., "On the Speedup Required for a Multicast Parallel Packet Switch", pp. 269-271, IEEE Communication Letters, vol. 5, No. 6, Jun. 2001.
McKeown, Nick, "The iSLIP Scheduling Algorithm for Input-Queued Switches", 36 pgs., IEEE Transactions on Networking, vol. 7, No. 2, Apr. 1999.
Prabhakar, B., et al., "On the Speedup Required for Combined Input and Output Queued Switching", pp. 1-13, Computer Systems Technical Report, CSL-TR-97-738, Nov. 1997.

* cited by examiner

*Primary Examiner* — VanThu Nguyen
(74) *Attorney, Agent, or Firm* — LeRoy D. Maunu

(57) ABSTRACT

A memory arrangement includes a plurality of memory blocks, a first group of access ports, and a second group of access ports. Routing circuitry couples each pair of the first and second groups of access ports to a respective one of the memory blocks. Each pair includes a first access port from the first group and a second access port from the second group. The first access port has write access to a first portion of the respective memory blocks but not to a second portion of the memory block, and has read access to the second portion but not to the first portion. The second access port has write access to the second portion but not to the first portion, and has read access to the first portion but not to the second portion.

20 Claims, 7 Drawing Sheets

CONTENTION-FREE MEMORY ARRANGEMENT

FIELD OF THE INVENTION

One or more embodiments generally relate to data storage and retrieval.

BACKGROUND

Many network devices include a bridge interface to translate data from one protocol format to another, route data, or perform other processing. For example, a bridge interface may be implemented to convert data packet formats between networks.

As another example, a bridge interface may be used to translate data formats between a network and a computing system. For ease of explanation, the embodiments and examples are primarily described with reference to a network bridge configured to provide an interface between an optical network and a computing system connected thereto.

To reduce the time and investment required for design and debugging, bridge interfaces may be implemented using programmable integrated circuits (IC), which include a number of logic and routing resources that may be configured to implement a circuit design. Programmable ICs allow a circuit design to be implemented, tested, and revised without realizing the circuit design as an application specific IC (ASIC). In this manner, development time and costs may be reduced.

Bridge interfaces often buffer data packets in a memory for efficient processing. Conventional bridge interfaces use off-chip memory (e.g., DRAM) to implement data buffering. However, for high transmission speed applications (e.g., 400 Gbps full duplex), such as those employed in optical networks, there are often not enough pins in a programmable IC package to compensate for reductions in throughput posed by access conflicts to the memory.

One or more embodiments may address one or more of the above issues.

SUMMARY

In one embodiment, a memory arrangement is provided. The memory arrangement includes a plurality of memory blocks, a first group of access ports, and a second group of access ports. Routing circuitry couples each pair of the first and second groups of access ports to a respective one of the plurality of memory blocks. Each pair of access ports includes a first access port from the first group and a second access port from the second group. The first access port has write access to a first portion of the respective one of the plurality of memory blocks but not to a second portion of the memory block, and has read access to the second portion of the memory block but not to the first portion of the memory block. The second access port has write access to the second portion of the respective memory block but not to the first portion of the memory block, and has read access to the first portion of the memory block but not to the second portion of the memory block.

In another embodiment, a network interface circuit is provided. The network interface circuit includes a network-side serializer/deserializer (SerDer) circuit, a first group of access ports coupled to the network-side SerDes circuit, a system-side SERDES circuit, and a second group of access ports coupled to the system-side SerDes circuit. A plurality of memory blocks and routing circuitry are included on a stack of semiconductor dice. The routing circuitry couples the plurality of memory blocks to the first and second groups of access ports. For each memory block, a respective first access port has write access to a first portion of the memory blocks but not to a second portion of the memory block, and has read access to the second portion of the memory block but not to the first portion of the memory block. A second access port has write access to the second portion of the respective memory block but not to the first portion of the memory block, and has read access to the first portion of the memory block but not to the second portion of the memory block.

In yet another embodiment, a bridge interface circuit is provided. A first transceiver circuit is configured to receive and transmit data in a first data format. A second transceiver circuit is configured to receive and transmit data in a second format. A translation circuit is coupled to the first and second transceiver circuits. The translation circuit is configured to convert data from the first format to the second format, and convert data from the second format to the first format. A memory circuit is coupled to the translation circuit. The memory circuit includes a plurality of memory blocks, a first group of access ports, a second group of access ports, and routing circuitry coupling each pair of the first and second groups of access ports to a respective one of the plurality of memory blocks. Each pair of access ports of the first and second groups of access ports includes a first access port from the first group of access ports and a second access port from the second group of access ports. Each first access port has write access to a first portion of the respective one of the plurality of memory blocks but not to a second portion of the memory block, and has read access to the second portion of the memory block but not to the first portion of the memory block. Each second access port has write access to the second portion of the respective memory block but not to the first portion of the memory block, and has read access to the first portion of the memory block but not to the second portion of the memory block.

Other embodiments will be recognized from consideration of the Detailed Description and Claims, which follow.

BRIEF DESCRIPTION OF THE DRAWINGS

Various aspects and advantages of the disclosed embodiments will become apparent upon review of the following detailed description and upon reference to the drawings in which.

DETAILED DESCRIPTION OF THE DRAWINGS

For high-speed bridge interface applications, there are often not enough available pins in a programmable IC package to compensate for reductions in throughput due to conflicting accesses of the memory. However, memory capacity requirements for bridge interfaces are generally low enough (e.g., 1 GB to 2 GB) to allow the memory to be integrated within a programmable IC package using current processing technologies. Previous bridge interface implementations utilize control logic to arbitrate memory accesses to avoid access conflicts. However, implementing such control logic in a programmable IC requires many programmable resources, and thereby reduces the number of programmable resource available to implement logic of the bridge interface. One or more embodiments provide an efficient memory arrangement that is conflict-free. Because the system is conflict-free, programmable resources are not required to implement arbitration circuitry.

In one or more embodiments, a memory arrangement is provided for conflict-free memory access. The memory arrangement implements an efficient routing system to direct access to specific memory addresses so that arbitration is not needed.

Figure 1:
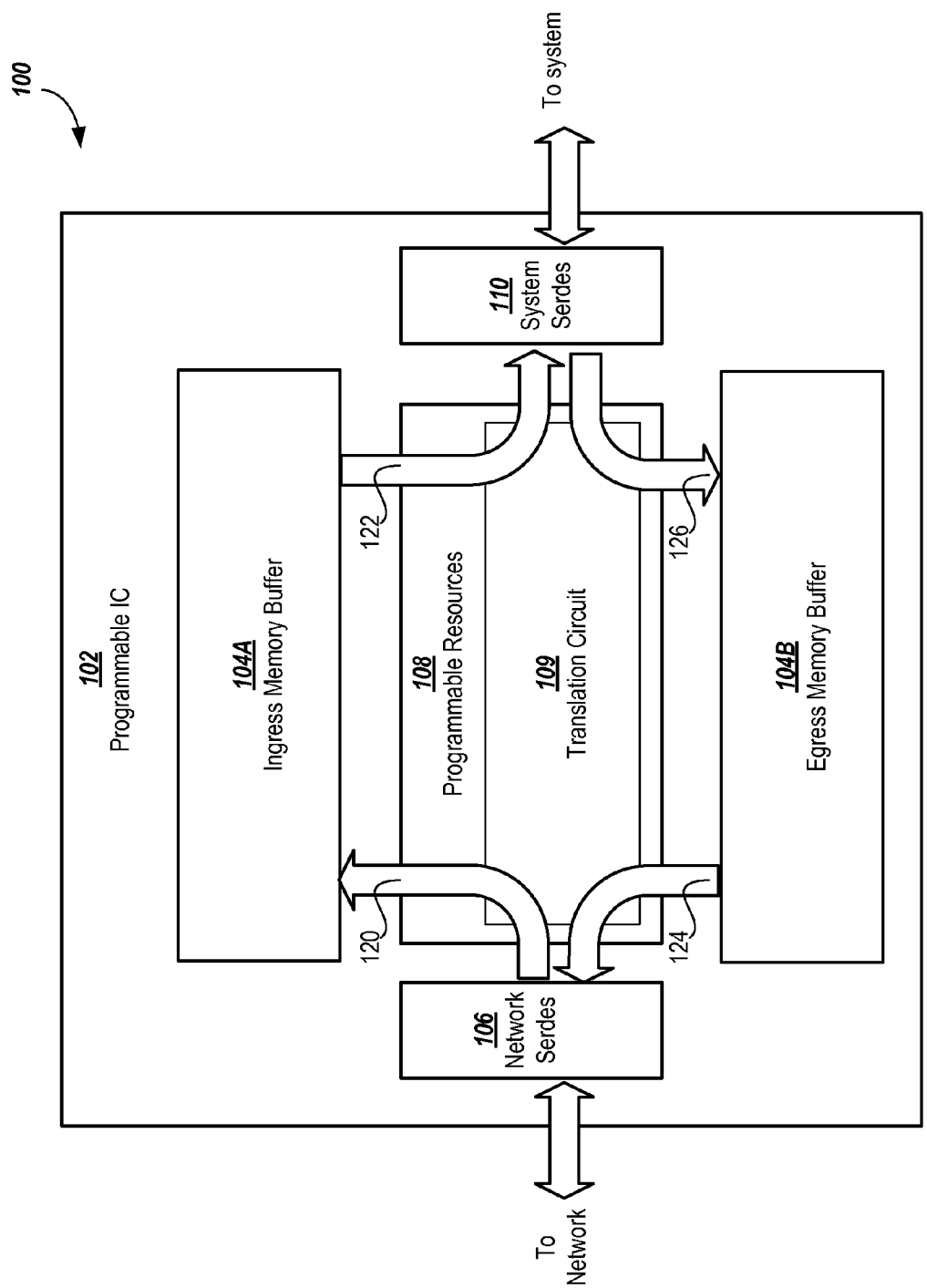
FIG. 1 shows a block diagram of a network interface implemented with a programmable IC in accordance with one or more embodiments.

FIG. 1 shows a block diagram of a bridge interface implemented with a programmable IC in accordance with one or more embodiments. In this example, the network bridge interface 100 is implemented using a programmable IC 102. The programmable IC 102 includes a first set of serializer/deserializer (SerDes) transceiver circuits 106 for transmission and reception of data in a first protocol format used by a network and a second set of SerDes transceiver circuits 110 for transmission and reception of data in a second protocol format used by a system. For ease of reference, data received from the network for transmission to the system side may be referred to as ingress data, and data received from the system for transmission to the network may be referred to an egress data. In this example, Arrows 120 and 122 depict ingress dataflow through ingress memory buffer 104A. Arrows 124 and 126 depict egress dataflow through egress memory buffer 104B. Programmable resources 108 are used to implement a translation circuit 109 that converts data between first and second protocol formats and routes ingress and egress data to and from respective memory buffers 104A and 104B.

Figure 2:
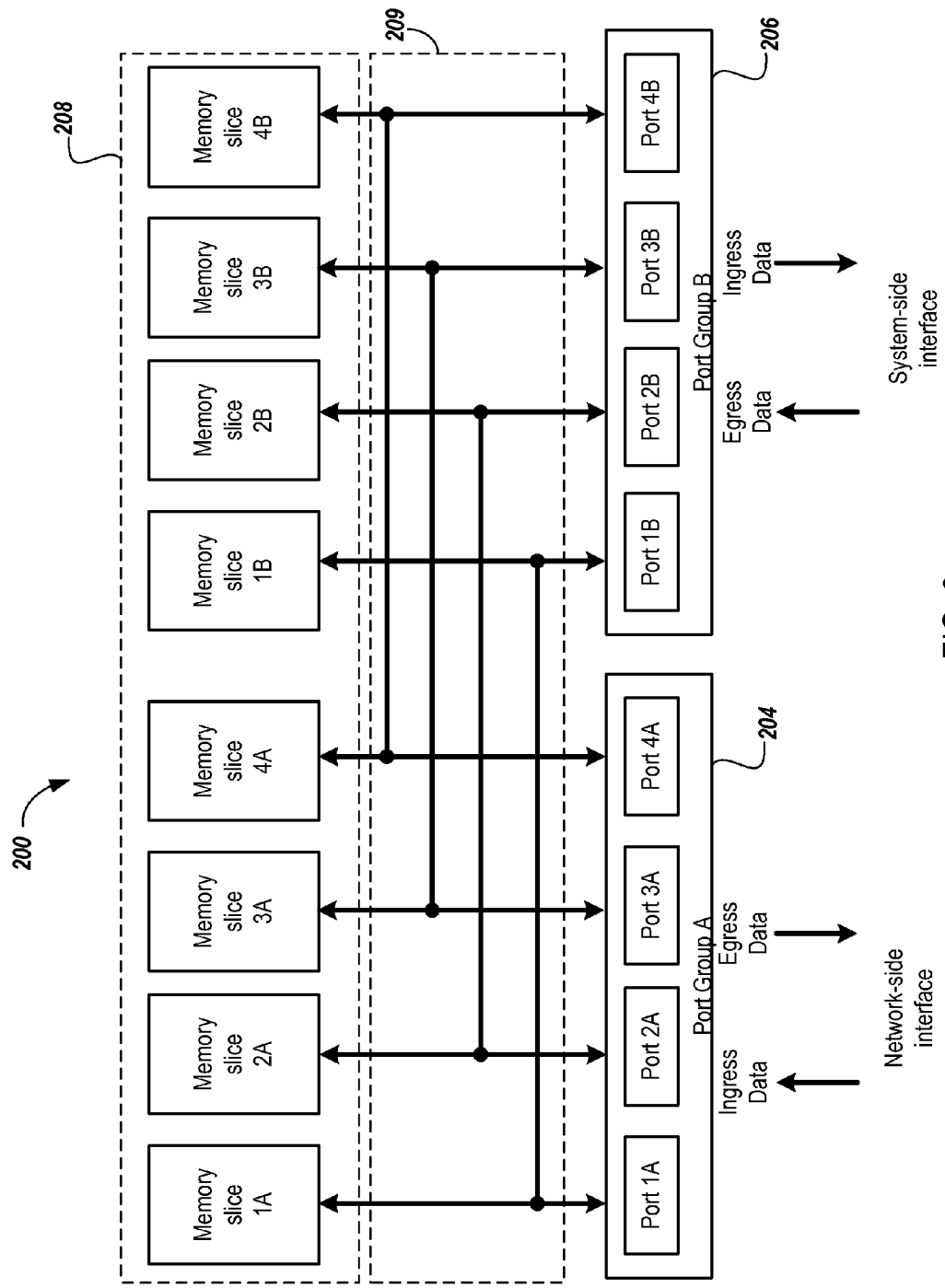
FIG. 2 shows a block diagram of the memory architecture.

FIG. 2 shows a block diagram of a memory architecture 200 that may be used to implement a bridge interface circuit in accordance with one or more embodiments. Data received from and directed to the network is written to and read from memory 208 via a first port group 204 (port group A), and data received from and directed to a system is written to and read from the memory via a second port group 206 (port group B). The memory architecture organizes ports of the two port groups into pairs and limits memory accesses of each pair to a respective partition of the memory. In this example, the memory is partitioned into four memory blocks, each memory block including a pair of memory slices. For example, the routing circuitry 209 is configured to allow only port 1A and port 1B access to a first memory block consisting of memory slices 1A and 1B. As another example, only ports 2A and 2B are allowed access to a second memory block consisting of memory slices 2A and 2B. For each port group pair, ingress data is processed using a first one of the memory slices of the corresponding block, and egress data is processed using a second one of the memory slices of the block. For example, in one implementation, for the port group pair that includes ports 1A and 1B, ingress data is processed using memory slice 1A and egress data is processed using memory slice 1B. So long as each slice of the memory block is implemented to give exclusive write access to one port of the port group pair (e.g., 1A and 1B) and exclusive read access to the other, ingress data and egress data can be processed using different portions of the data block (i.e., different memory slices) to prevent the ports in the port group pair from competing for read or write access to the portion of memory. In this manner, ingress and egress data can be processed in a conflict-free manner.

Figure 3:
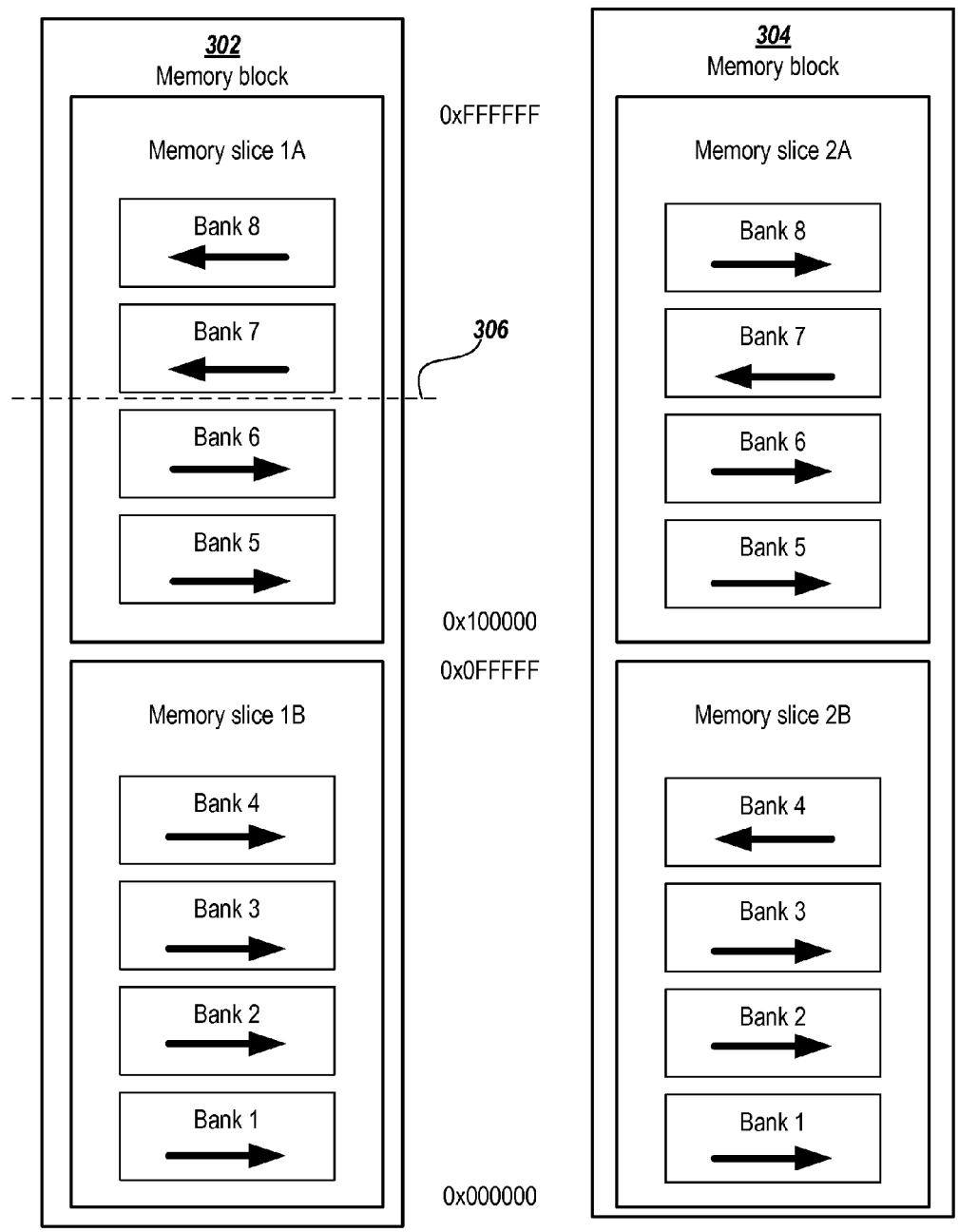
FIG. 3 shows memory blocks partitioned respective groups of memory banks for ingress data and for egress data.

While the above example partitions each memory block into one slice for ingress data and one slice for egress data, it is recognized that in one or more embodiments each memory block may be partitioned to use different amounts of memory for ingress and egress data. For example, in many applications ingress data buffering may require more memory to alleviate congestion than egress data buffering. FIG. 3 shows memory blocks partitioned into respective groups of memory banks for ingress data and for egress data in accordance with one or more embodiments. Memory blocks 302 and 304 illustrate some different partitioning arrangements of the memory blocks. In this example, each memory block 302 and 304 includes two respective memory slices (e.g., slices 1A and 1B) that together comprise an address space that ranges from 0x000000 to 0xFFFFFF.

Each memory slice includes (e.g., slice 1A) four memory banks (e.g., banks 5-8) that may be independently accessed. For example, each bank may be a multi-port memory (e.g., one-read one-write memory). The memory blocks 302 and 304 may be partitioned at any address boundary between memory banks. A right facing arrow indicates memory banks used for ingress data and a left-facing arrow indicates banks used for egress data. In this example, each of memory blocks 302 and 304 are partitioned to allocate two memory banks for egress data and six memory banks for ingress data. Memory block 302 is partitioned into two contiguous groups of memory banks at boundary 306. Addresses below the boundary 306 are used for ingress data and addresses above the boundary are used for egress data. In another embodiment, memory blocks may be partitioned in any manner between memory banks. For example, as illustrated in memory block 304, banks 1-3 in memory slice 2B and banks 5, 6, and 8 in memory slice 2A are for ingress data; bank 4 in memory slice 2B and bank 7 in memory slice 2A are for egress data.

It is understood that the memory circuits used to implement each memory block have a number of ports that may be used to read from or write to memory cells of the memory circuit. To distinguish the ports of the individual memory circuits from the ports of port groups A and B, the ports of the memory circuits may be referred to as internal ports. To provide exclusive read and write access for a partitioned slice, each slice is implemented with two internal write ports—one for each port of the port group (e.g., port group A and port group B). This allows a port from port group A to write data to a first partition of the slice, and a port from port group B to write data to a second partition of the slice, without contention. Likewise, each slice has two internal read ports. Depending on the configuration of read and write internal ports of the memory used to implement the memory slices, each memory slice can have two internal ports, each port capable of reading and writing ("2RW"); or each memory slice can have two dedicated read ports and two dedicated write ports ("2R2W").

In one or more embodiments, the memory slices may be dynamically partitioned into ingress and egress portions depending on the requirements of the particular application. For example, the memory banks of each slice may be a 1R1W memory. The internal read and write ports of each bank may be independently programmed to be read by one port group and written by a different port group. Such configurability requires programmable connections of the read and write addresses from both port groups (e.g., internal ports of the slice) to internal ports of every bank in the slice.

Figure 4:
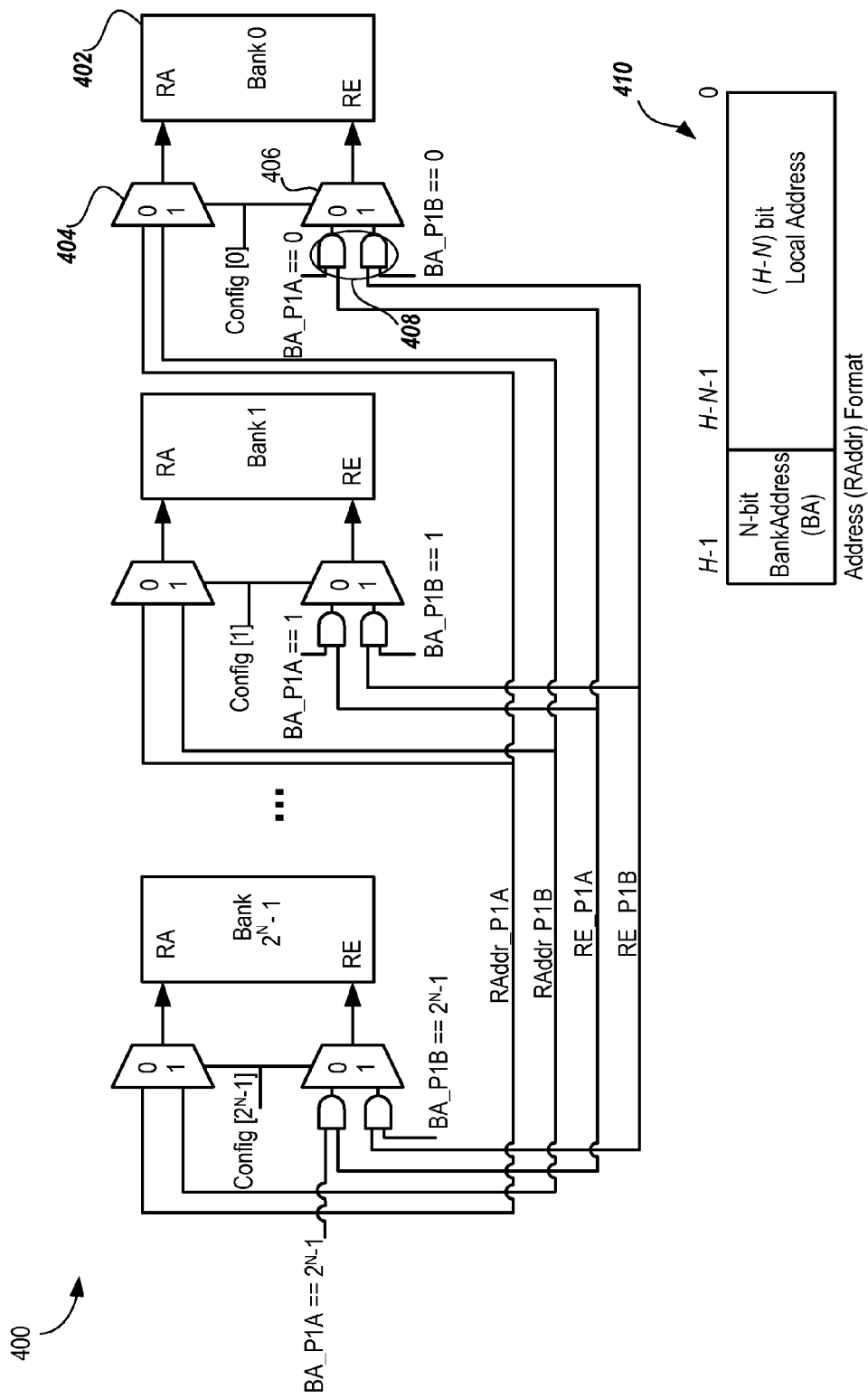
FIG. 4 shows a block diagram of a circuit that may be configured to control access to read/write ports of memory banks of a partitioned memory slice.

FIG. 4 shows a block diagram of circuitry that may be configured to control read access to memory banks of a partitioned memory slice. Write access to each memory bank may be implemented in a similar manner. In this example, each bank (e.g., 402) has a read enable control input (RE) and a read address input (RA). The RE input is coupled to the output of a 2:1 multiplexer (e.g., 406). Multiplexer 406 selects an enable signal to input to the respective bank based on a configuration signal (e.g., Config[0]). The two inputs to this 2:1 multiplexer 406 are in response to the read request signal from the port in Port 1A, and the read request signal from the Port 1B. The select input to the multiplexer is a static signal (Config[0] or "Config" for short), which selects whether this bank should be read by Port 1A or Port 1B. The Config signal is set during initialization (e.g., as part of the FPGA configuration bit stream). AND gates 408 forward enable signals RE_P1A and RE_P1B corresponding to ports 1A and 1B to the multiplexer 406 only if a bank address (BA) of the read address (e.g., RAddr_P1A or RAddr_P1B) is the bank address of the respective bank (e.g., 402).

The read address port to bank 402 is similarly multiplexed by multiplexer 404. The multiplexer 404 selects an address signal (e.g., RAddr_P1A or RAddr_P1B) based on the Config signal. For instance, in response to Config[0] being 0, bank 402 is readable only by Port 1A and not Port 1B, and in response to Config[0] being 1, bank 402 is readable only by Port 1B and not Port 1A. This select signal effectively ignores illegal read addresses. Similar logic may be used to detect access violations and generate an error signal. The error signal may be used to signal to external circuit, e.g., a memory controller, that the read/write request was denied access to the memory.

Figure 5:
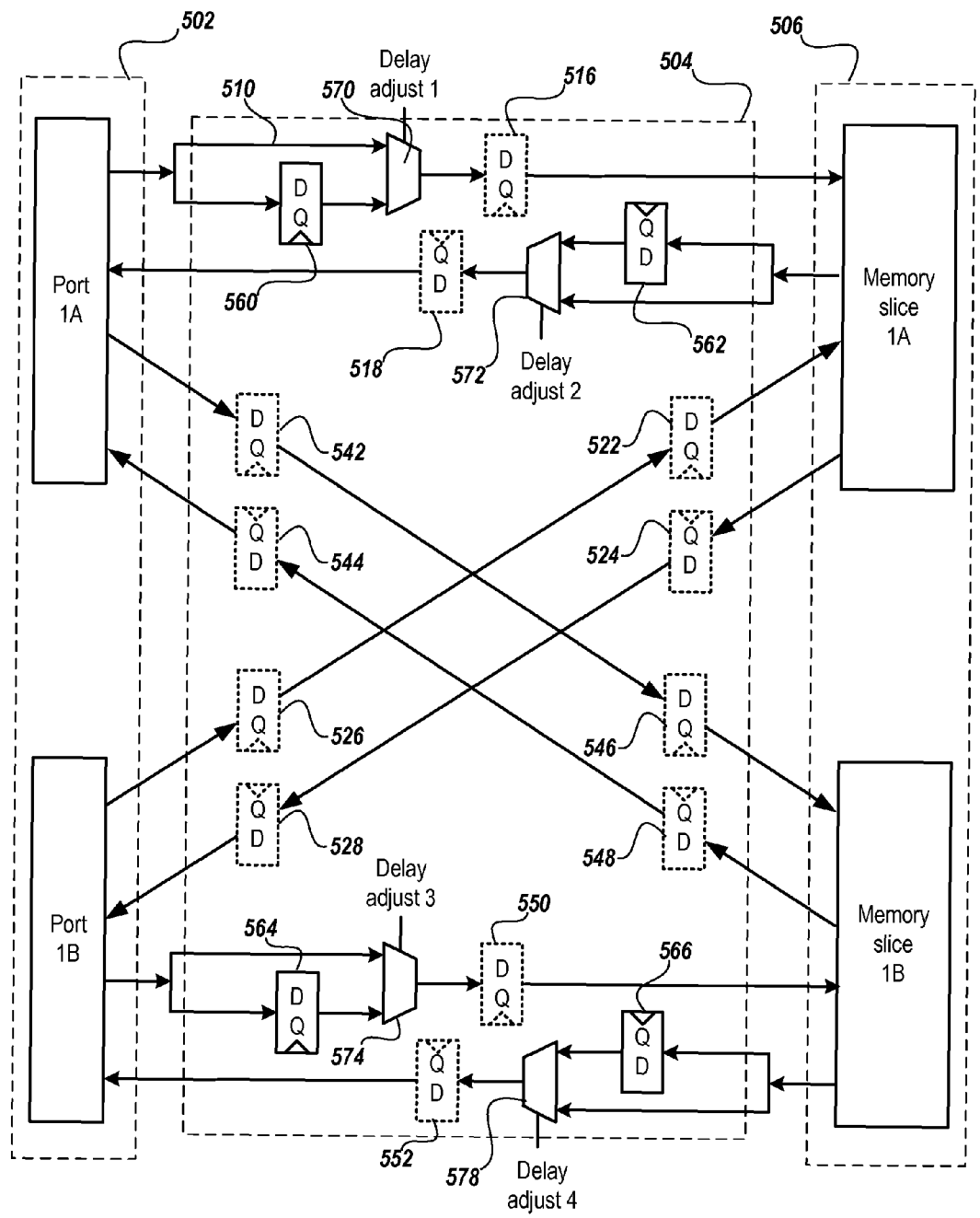
FIG. 5 shows a block diagram of routing circuitry that may be used to route data between ports groups and memory in accordance with one or more embodiments.

In one or more embodiments, the memory access of memory blocks of each respective pair of ports (e.g., FIG. 2, Ports 1A and 1B), is enforced by implementing a routing system for each pair of ports. FIG. 5 shows a block diagram of a routing circuit 504 that may be used to route data between a pair of ports 502 and a memory block 506 having memory slices 1A and 1B in accordance with one or more embodiments. The routing circuitry 504 is configured in a butterfly layout in which a read path and a write path are provided from each port of the pair of ports 502 to each partition (i.e., slices 1A and 1B) of the memory block 506.

Routing ingress or egress data between ports via the memory may incur different amounts of delay depending on the length of each signal path. For illustrative purposes, dashed flip-flops 516, 518, 522, 524, 526, and 528 are provided in FIG. 5 to visually represent the delay for paths through memory slice 1A. It should be understood that the routing circuitry does not actually include these flip-flops. Rather, each dashed flip-flop represents one clock cycle of signal propagation delay. Similarly, the delay for paths through memory slice 1B is depicted by dashed flip-flops 542, 544, 546, 548, 550, and 552. The diagonal paths are longer in this example and, thus, incur more delay. If uncorrected, differences in the path lengths may cause data read from two different memory locations to arrive at port 1A of the pair of ports 502 at the same time, thereby creating a conflict, or arrive in incorrect order. For example, suppose that memory slice 1A is located close to the access ports 502 and memory slice 1B is located a greater distance from the access ports 502. If a first ingress data packet is written to and then read from memory slice 1B (e.g., written and read over a long signal path) and the next ingress data packed is written to and then read from memory slice 1A (e.g., written and read over a short signal path), the second ingress data packet may be output before the first ingress data packet.

To avoid conflicts and out-of-order data, each ingress and egress path between the pair of access ports 502 may include programmable delay circuitry to adjust the delay of the ingress and egress paths and reduce delay variation. In this example, two multiplexor (MUX) selectable paths (e.g., 510 and 560) implement each of the programmable delay circuits. For each ingress and egress path the routing circuitry 504 includes a flip-flop (560, 562, 564, and 566) to provide additional delay that may be used for correction. A respective MUX (570, 572, 574, and 578) routes data from one of the MUX-selectable paths as directed by a respective control signal (Delay adjust 1-4). In this manner, variation in propagation delay of the various paths may be compensated for.

The routing circuitry 504 shown in FIG. 5 implements a fixed routing between access ports 502 and memory block 506 to avoid the memory access conflicts as discussed above. One or more embodiments may implement similar routing restriction using dynamic routing circuitry, such as a crossbar switch. In one or more embodiments crossbar switches are used for routing and buffering data of one port when another port is trying to write to the same memory address in the same cycle. To provide sufficient throughput, the crossbar switch may be clocked at rate that is at least twice the rate that accesses to a memory block may occur. If a data packet is buffered at a port due to an access conflict, the switch is capable of routing the buffered data packet and any new data packet in the next cycle (assuming the data packets are to be written to different memory locations). Details regarding congestion use of a crossbar switch reduce effects of contention (such as head-of-line blocking) are explained further in Sundar Iyer and Nick McKeown, *On the Speedup Required for a Multicast Parallel Packet Switch*, IEEE Communication Letters, vol. 5, no. 6, pp. 269 (June 2001), which is fully incorporated by reference herein.

In one or more embodiments, a contention-free memory arrangement, as discussed with reference to the above examples, may be implemented using ASIC circuitry on one or more dice that can be stacked on a programmable IC. Because the memory arrangement is implemented separate from the programmable IC, more programmable resources of the programmable IC remain available for implementation of a circuit design.

Figure 6:
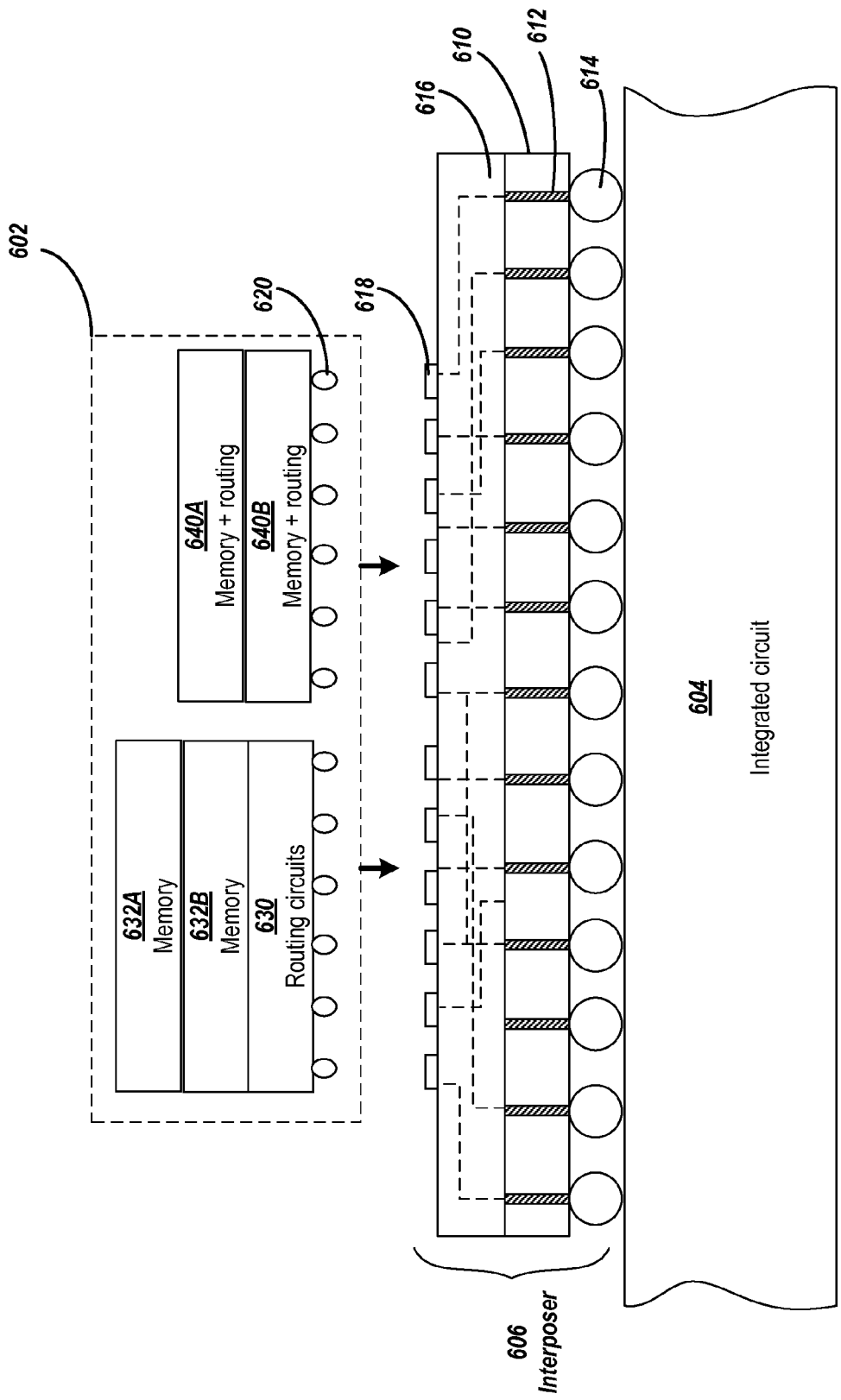
FIG. 6 shows a side view of a memory arrangement implemented using a plurality of dice stacked on an interposer that may be coupled to an integrated circuit in accordance with one or more embodiments.

FIG. 6 shows a side view of a memory arrangement implemented using a plurality of dice stacked on an interposer that may be coupled to an integrated circuit, in accordance with one or more embodiments. The interposer 606 electrically couples contacts of the memory arrangement 602 to an IC 604, which accesses the memory arrangement. The interposer includes an interposer body 610 having a number of through-silicon vias (TSVs) 612 that are formed in the body. A contact array having a plurality of solder ball contacts 614 is formed on a backside of the interposer body 610. The solder ball contacts 614 are coupled to respective ones of the TSVs. One or more wiring layers 616 implement a plurality of circuit paths, which couple the TSVs to respective contact pads 618 of a second contact array. The second contact array is configured to align with microbump contacts 620 of the memory arrangement 602. Because the interposer can be easily redesigned and implemented to adjust routing between the IC 604 and the memory arrangement 602, circuits of the IC 604 may be placed and routed (in the IC) without regard to which microbumps 620 of the memory arrangement 602 correspond to which specific port groups. This allows placement and routing of the IC 604 to be performed more optimally, and allows a layout of the memory arrangement 602 to be easily used with a variety of designs implemented on IC 604. While the examples and embodiments are primarily described with reference to use of an interposer to connect the memory arrangement 602 to an IC 604, it is recognized that the memory arrangement 602 may be directly coupled to the IC 604 without an interposer.

The memory dice of memory arrangement 602 may be arranged and connected in a number of alternative configurations. For example, dice implementing the memory arrangement may be arranged in a single stack of multiple dice or in multiple stacks having one or more dice. In the example of FIG. 6, the memory arrangement is depicted as being implemented in two stacks. The routing circuits discussed with reference to FIGS. 1-4 may be configured in a number of alternative die stack arrangements. For example, in the left stack, memory dice 632A and 632B are stacked on an IC die 630 that implements the routing circuitry. Because routing is implemented in die 630, the routing circuit can be configured and constructed to be compatible with different configurations of memory dice. As another example, each of memory dice 640A and 640B of the right stack implement some memory blocks and routing circuitry of the memory arrangement 602. Because each pair of ports has exclusive access to a memory block, each pair of ports operates independent of the others. As a result, memory and corresponding routing circuitry of different port group pairs can be implemented in different ones of the stacked dice.

Figure 7:
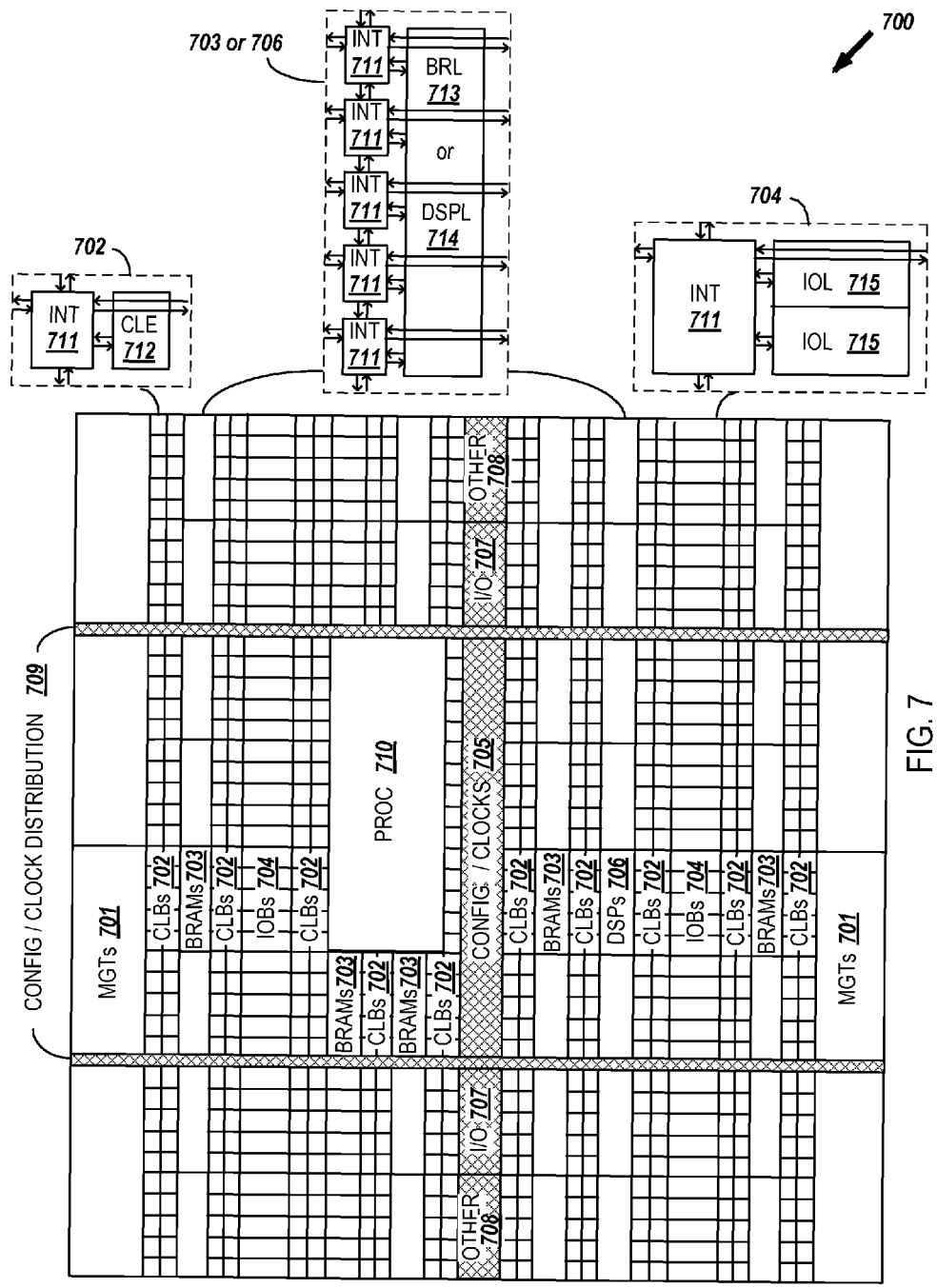
FIG. 7 shows an example programmable IC that may be configured in accordance with one or more embodiments.

FIG. 7 shows an example programmable IC that may be configured in accordance with one or more embodiments. The illustrated programmable IC is known as a field programmable gate array (FPGA). FPGAs can include several different types of programmable logic blocks in the array. For example, FIG. 7 illustrates an FPGA architecture (700) that includes a large number of different programmable tiles including multi-gigabit transceivers (MGTs 701), configurable logic blocks (CLBs 702), random access memory blocks (BRAMs 703), input/output blocks (IOBs 704), configuration and clocking logic (CONFIG/CLOCKS 705), digital signal processing blocks (DSPs 706), specialized input/output blocks (I/O 707), for example, e.g., clock ports, and other programmable logic 708 such as digital clock managers, analog-to-digital converters, system monitoring logic, and so forth. Some FPGAs also include dedicated processor blocks (PROC 710) and internal and external reconfiguration ports (not shown)

In some FPGAs, each programmable tile includes a programmable interconnect element (INT 711) having standardized connections to and from a corresponding interconnect element in each adjacent tile. Therefore, the programmable interconnect elements taken together implement the programmable interconnect structure for the illustrated FPGA. The programmable interconnect element INT 711 also includes the connections to and from the programmable logic element within the same tile, as shown by the examples included at the top of FIG. 7.

For example, a CLB 702 can include a configurable logic element CLE 712 that can be programmed to implement user logic plus a single programmable interconnect element INT 711. A BRAM 703 can include a BRAM logic element (BRL 713) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 706 can include a DSP logic element (DSPL 714) in addition to an appropriate number of programmable interconnect elements. An IOB 704 can include, for example, two instances of an input/output logic element (IOL 715) in addition to one instance of the programmable interconnect element INT 711. As will be clear to those of skill in the art, the actual I/O pads connected, for example, to the I/O logic element 715 are manufactured using metal layered above the various illustrated logic blocks, and typically are not confined to the area of the input/output logic element 715.

In the pictured embodiment, a columnar area near the center of the die (shown shaded in FIG. 7) is used for configuration, clock, and other control logic. Horizontal areas 709 extending from this column are used to distribute the clocks and configuration signals across the breadth of the FPGA Some FPGAs utilizing the architecture illustrated in FIG. 7 include additional logic blocks that disrupt the regular columnar structure making up a large part of the FPGA. The additional logic blocks can be programmable blocks and/or dedicated logic. For example, the processor block PROC 710 shown in FIG. 7 spans several columns of CLBs and BRAMs Note that FIG. 7 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear, to facilitate the efficient implementation of user logic The embodiments are thought to be applicable to a variety of applications using memory. Other aspects and embodiments will be apparent to those skilled in the art from consideration of the specification. The embodiments may be implemented as one or more processors configured to execute software, as an application specific integrated circuit (ASIC), or as a logic on a programmable logic device. It is intended that the specification and illustrated embodiments be considered as examples only, with a true scope of the invention being indicated by the following claims.

What is claimed is:

1. A memory arrangement, comprising:
  a plurality of memory blocks;
  a first group of access ports, and a second group of access ports;
  routing circuitry coupling each pair of the first and second groups of access ports to a respective one of the plurality of memory blocks, each pair of the first and second groups of access ports including a first access port from the first group of access ports and a second access port from the second group of access ports; and
  wherein:
    each first access port has write access to a first portion of the respective one of the plurality of memory blocks, has read access to a second portion of the respective one of the plurality of memory blocks, does not have read access to the first portion of the respective one of the plurality of memory blocks, and does not have write access to the second portion of the respective one of the plurality of memory blocks; and
    each second access port has write access to the second portion of the respective one of the plurality of memory blocks, has read access to the first portion of the respective one of the plurality of memory blocks, does not have read access to the second portion of the respective one of the plurality of memory blocks, and does not have write access to the first portion of the respective one of the plurality of memory blocks.

2. The memory arrangement of claim 1, wherein:
   each first portion of each of the plurality of memory blocks is used exclusively for buffering egress data; and
   each second portion of each of the plurality of memory blocks is used exclusively for buffering ingress data.

3. The memory arrangement of claim 1, wherein the plurality of memory blocks is implemented on a plurality of stacked semiconductor dice.

4. The memory arrangement of claim 3, wherein each of the plurality of memory blocks is implemented on a respective one of the plurality of stacked semiconductor dice.

5. The memory arrangement of claim 3, further comprising:
   an interposer, wherein the plurality of stacked semiconductor dice is electrically coupled to contacts on a front-side of the interposer.

6. The memory arrangement of claim 1, wherein each of the plurality of memory blocks includes two memory slices.

7. The memory arrangement of claim 1, wherein the routing circuitry includes programmable delay circuitry that is configurable to adjust timing on one or more paths between the plurality of memory blocks and the first and second groups of access ports.

8. The memory arrangement of claim 7, wherein timing is not adjusted for the path of the one or more paths that exhibits the least latency.

9. The memory arrangement of claim 7, wherein the programmable delay circuitry includes a plurality of MUX selectable paths, each of the MUX selectable paths including a different number of flip-flops.

10. The memory arrangement of claim 1, wherein, for each of the plurality of memory blocks, the first and second portions of the memory block each include a whole number of memory banks.

11. The memory arrangement of claim 1, wherein the routing circuitry includes a crossbar switch coupled to the plurality of memory blocks and first and second groups of access ports, the crossbar switch being clocked at a rate that is greater than the rate at which sequential accesses of the memory blocks may occur, to reduce head-of-line blocking.

12. The memory arrangement of claim 1, wherein the plurality of memory blocks and the routing circuitry are configured and arranged to:
   for each memory block, adjust an amount of the memory block included in the respective first portion and the amount of the memory block included in the respective second portion in response to a configuration bitstream.

13. The memory arrangement of claim 12, wherein each of the plurality of memory blocks includes:
   a plurality of memory banks, each memory bank having one or more access ports; and
   for each memory bank, a respective selection circuit configured to forward read requests from one access port of the corresponding pair of the first and second groups of access ports that is indicated by the configuration bitstream to the one or more access ports of the memory bank, and configured to forward write requests from the other access port of the corresponding pair of the first and second groups of access ports to the one or more access ports of the memory bank.

14. A network interface circuit, comprising
   a network-side serializer/deserializer (SerDes) circuit;
   a first group of access ports coupled to the network-side SerDes circuit;
   a system-side SerDes circuit;
   a second group of access ports coupled to the system-side SerDes circuit;
   a plurality of stacked semiconductor dice including a plurality of memory blocks and routing circuitry coupling the plurality of memory blocks to the first and second groups of access ports; and wherein:
   for each memory block of the plurality of memory blocks:
      a respective first access port of the first group of access ports has write access to a first portion of the respective one of the plurality of memory blocks, has read access to a second portion of the respective one of the plurality of memory blocks, does not have read access to the first portion of the respective one of the plurality of memory blocks, and does not have write access to the second portion of the respective one of the plurality of memory blocks; and
      a respective second access port of the second group of access ports has write access to the second portion of the respective one of the plurality of memory blocks, has read access to the first portion of the respective one of the plurality of memory blocks, does not have read access to the second portion of the respective one of the plurality of memory blocks, and does not have write access to the first portion of the respective one of the plurality of memory blocks.

15. The network interface circuit of claim 14, wherein the routing circuit includes a crossbar switch clocked at a rate that is greater than twice the rate at which sequential accesses of the memory blocks may occur.

16. The network interface circuit of claim 14, wherein:
   each first portion of each memory block is used exclusively for buffering egress data; and
   each second portion of each memory block is used exclusively for buffering ingress data.

17. The network interface circuit of claim 14, wherein, for each memory block, the first and second portions of the memory block each include a whole number of memory banks.

18. A bridge interface circuit, comprising:
   a first transceiver circuit configured to receive and transmit data in a first data format;
   a second transceiver circuit configured to receive and transmit data in a second format;
   a translation circuit coupled to the first and second transceiver circuits, the translation circuit configured to convert data from the first format to the second format, and convert data from the second format to the first format;
   a memory circuit coupled to the translation circuit, the memory circuit having:
      a plurality of memory blocks;
      a first group of access ports, and a second group of access ports; and
      routing circuitry coupling each pair of the first and second groups of access ports to a respective one of the plurality of memory blocks, each pair of access ports of the first and second groups of access ports including a first access port from the first group of access ports and a second access port from the second group of access ports; and
   wherein:
      each first access port has write access to a first portion of the respective one of the plurality of memory blocks, has read access to a second portion of the respective one of the plurality of memory blocks, does not have read access to the first portion of the respective one of the plurality of memory blocks, and does not have write access to the second portion of the respective one of the plurality of memory blocks; and each second access port has write access to the second portion of the respective one of the plurality of memory blocks, has read access to the first portion of the respective one of the plurality of memory blocks, does not have read access to the second portion of the respective one of the plurality of memory blocks, and does not have write access to the first portion of the respective one of the plurality of memory blocks.

19. The bridge interface circuit of claim 18, wherein the translation circuit is configured to:
   route data between the first transceiver circuit and the memory circuit through only the first port group; and
   route data between the second transceiver circuit and the memory circuit through only the second port group.

20. The bridge interface circuit of claim 18, wherein:
   the first port group is located closer to the first transceiver than the second port group; and
   the second port group is located closer to the second transceiver than the first port group.

* * * * *